US012793768B2

(12) United States Patent
Bains

(10) Patent No.: US 12,793,768 B2
(45) Date of Patent: Nov. 10, 2026

(54) METHOD TO IMPLEMENT HALF WIDTH MODES IN DRAM AND DOUBLING OF BANK RESOURCES

(71) Applicant: Intel Corporation, Santa Clara, CA (US)

(72) Inventor: Kuljit S. Bains, Olympia, WA (US)

(73) Assignee: INTEL CORPORATION, Santa Clara, CA (US)

( * ) Notice: Subject to any disclaimer, the term of this patent is extended or adjusted under 35 U.S.C. 154(b) by 74 days.

(21) Appl. No.: 17/944,980

(22) Filed: Sep. 14, 2022

(65) Prior Publication Data

US 2023/0013181 A1 Jan. 19, 2023

(51) Int. Cl.
*G11C 11/4096* (2006.01)
*G11C 11/4076* (2006.01)

(52) U.S. Cl.
CPC ...... *G11C 11/4096* (2013.01); *G11C 11/4076* (2013.01)

(58) Field of Classification Search
CPC ............ G11C 11/4096; G11C 11/4076; G11C 11/4063; G06F 13/14; G06F 13/16; G06F 13/1668; G06F 13/1678; G06F 13/1684
See application file for complete search history.

(56) References Cited

U.S. PATENT DOCUMENTS

| | | | | |
|---|---|---|---|---|
| 8,243,486 B2 * | 8/2012 | Riho | G11C 5/02 | 365/189.05 |
| 11,894,099 B2 * | 2/2024 | Kim | G11C 29/023 | |
| 2016/0092383 A1 * | 3/2016 | Bains | G06F 13/287 | 710/308 |

* cited by examiner

*Primary Examiner* — Idriss N Alrobaye
*Assistant Examiner* — Richard B Franklin
(74) *Attorney, Agent, or Firm* — JAFFERY WATSON HAMILTON & DESANCTIS LLP

(57) ABSTRACT

Methods and apparatus implementing half width modes in DRAM and doubling of bank resources. DRAM devices, such as LPDDR6 SDRAM dies include multiple memory banks configured in memory groups and include I/O interface circuitry for first and second memory channels. A DRAM device may be selectively operated in a first half-width mode under which DQ lines for a partial memory channel operate as a first half-width DQ data bus. When operated in the first half-width mode, the partial memory channel is enabled to access all the memory banks on the DRAM. The DRAM device may also be selectively operated in a second half-width mode under which DQ lines for first and second partial memory channels operate as independent half-width DQ data buses. In this mode, each partial memory channel enables access to a respective portion of the memory banks.

20 Claims, 10 Drawing Sheets

| SDRAM Command | CS | CA0 | CA1 | CA2 | CK_t Edge |
|---|---|---|---|---|---|
| ACT-1 | H | H | H | H | R1 |
| | X | H | BA0 | BA1 | F1 |
| | H | V | BG0 | BG1 | R1 |
| | X | R18 | R19 | V | F2 |
| | H | R15 | R16 | R17 | R3 |
| | X | R12 | R13 | R14 | F3 |
| ACT-2 | CS | CA0 | CA1 | CA2 | |
| | H | L | H | H | R1 |
| | X | H | V | V | F1 |
| | H | R9 | R10 | R11 | R1 |
| | X | R6 | R7 | R8 | F2 |
| | H | R3 | R4 | R5 | R3 |
| | X | R0 | R10 | R11 | F3 |
| WRITE [BL24] | CS | CA0 | CA1 | CA2 | |
| | H | L | H | L | R1 |
| | X | H | BA0 | BA1 | F1 |
| | H | AP | BG0 | BG1 | R1 |
| | X | V | V | V | F2 |
| | H | C3 | C4 | C5 | R3 |
| | X | C0 | C1 | C2 | F3 |
| READ [BL24] | CS | CA0 | CA1 | CA2 | |
| | H | H | L | L | R1 |
| | X | H | BA0 | BA1 | F1 |
| | H | AP | BG0 | BG1 | R1 |
| | X | V | V | V | F2 |
| | H | C3 | C4 | C5 | R3 |
| | X | C0 | C1 | C2 | F3 |

400

| SDRAM Command | CS | CA0 | CA1 | CA2 | CK_t Edge |
|---|---|---|---|---|---|
| ACT-1 | H | H | H | H | R1 |
| | X | H | BA0 | BA1 | F1 |
| | H | V | BG0 | BG1 | R1 |
| | X | R18 | V | BG2 | F2 |
| | H | R15 | R16 | R17 | R3 |
| | X | R12 | R13 | R14 | F3 |
| ACT-2 | CS | CA0 | CA1 | CA2 | |
| | H | L | H | H | R1 |
| | X | H | V | V | F1 |
| | H | R9 | R10 | R11 | R1 |
| | X | R6 | R7 | R8 | F2 |
| | H | R3 | R4 | R5 | R3 |
| | X | R0 | R10 | R11 | F3 |
| WRITE [BL24] | CS | CA0 | CA1 | CA2 | |
| | H | H | H | L | R1 |
| | X | H | BA0 | BA1 | F1 |
| | H | AP | BG0 | BG1 | R1 |
| | X | V | V | BG2 | F2 |
| | H | C3 | C4 | C5 | R3 |
| | X | C0 | C1 | C2 | F3 |
| READ [BL24] | CS | CA0 | CA1 | CA2 | |
| | H | H | L | L | R1 |
| | X | H | BA0 | BA1 | F1 |
| | H | AP | BG0 | BG1 | R1 |
| | X | V | V | BG2 | F2 |
| | H | C3 | C4 | C5 | R3 |
| | X | C0 | C1 | C2 | F3 |

402

*Fig. 4a*

400

| | CS | CA0 | CA1 | CA2 | |
|---|---|---|---|---|---|
| REFRESH | H | L | L | H | R1 |
| | X | H | BA0 | BA1 | F1 |
| | H | AB | BG0 | BG1 | R2 |
| | X | V | V | V | F2 |
| | H | V | V | V | R3 |
| | X | V | V | V | F3 |

| | CS | CA0 | CA1 | CA2 | |
|---|---|---|---|---|---|
| PRECHARGE | H | H | L | H | R1 |
| | X | H | BA0 | BA1 | F1 |
| | H | AB | BG0 | BG1 | R2 |
| | X | V | V | V | F2 |
| | H | V | V | V | R3 |
| | X | V | V | V | F3 |

402

| | CS | CA0 | CA1 | CA2 | |
|---|---|---|---|---|---|
| REFRESH | H | L | L | H | R1 |
| | X | H | BA0 | BA1 | F1 |
| | H | AB | BG0 | BG1 | R2 |
| | X | V | V | BG2 | F2 |
| | H | V | V | V | R3 |
| | X | V | V | V | F3 |

| | CS | CA0 | CA1 | CA2 | |
|---|---|---|---|---|---|
| PRECHARGE | H | H | L | H | R1 |
| | X | H | BA0 | BA1 | F1 |
| | H | AB | BG0 | BG1 | R2 |
| | X | V | V | BG2 | F2 |
| | H | V | V | V | R3 |
| | X | V | V | V | F3 |

*Fig. 4b*

METHOD TO IMPLEMENT HALF WIDTH MODES IN DRAM AND DOUBLING OF BANK RESOURCES

BACKGROUND INFORMATION

The LPDDR4 (Low-Power Double Data Rate $4^{th}$ Generation) and LPDDR5 standards support a mode called BYTE mode where the device width is cut in half from an x16 device and the number of rows in a bank are doubled. A goal of BYTE mode is to increase the DRAM capacity by doubling the number of DRAMs (e.g., LPDDR4 or LPDDR5 DRAM chips) on a rank. However, the number of bank resources remain the same.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIGS. 4*a* and 4*b* show truth tables that respectively correspond to the embodiments of half-width mode configurations in FIGS. 3*a* and 3*b;*

DETAILED DESCRIPTION

Figure 1:
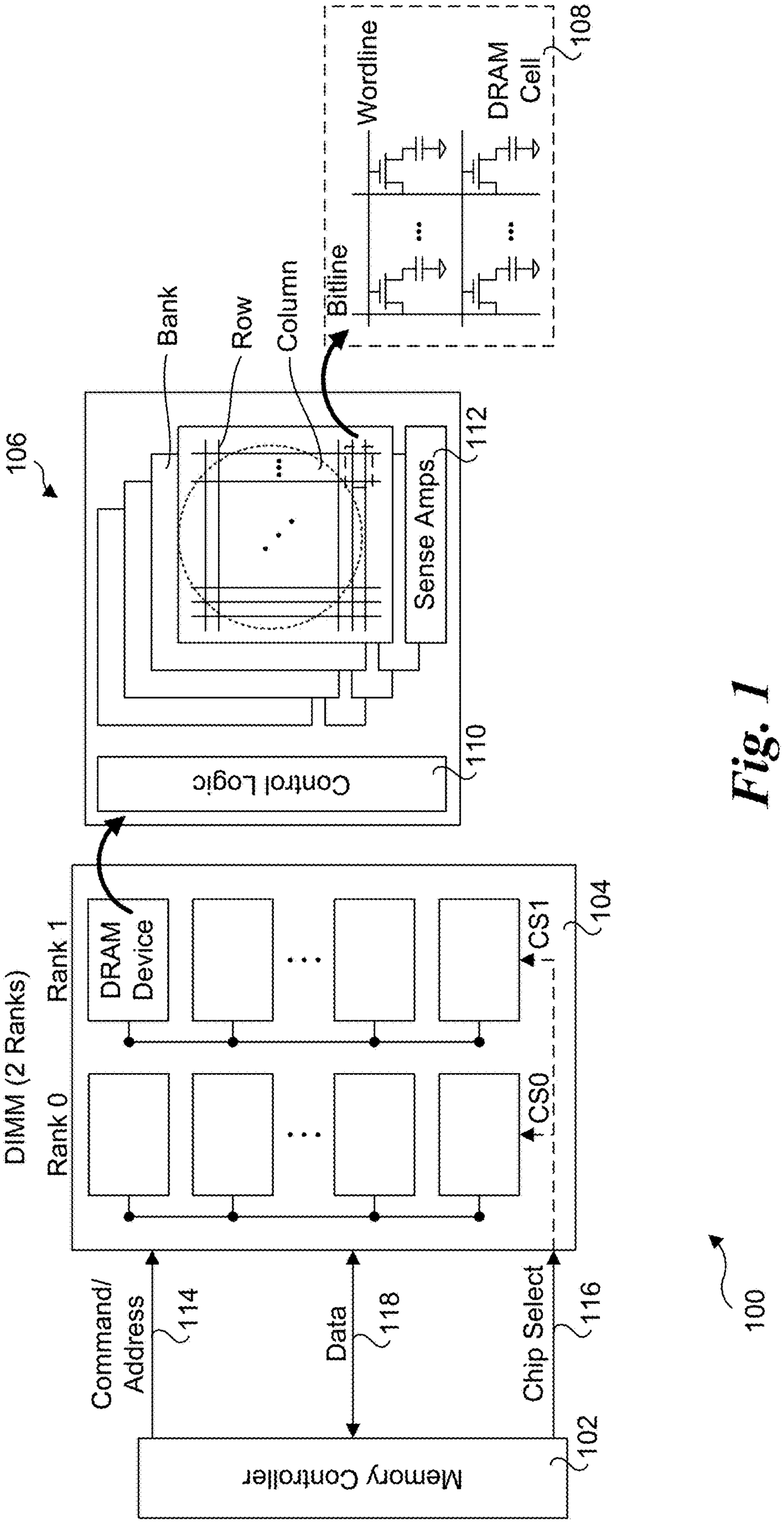
FIG. 1 is a diagram illustrating selective elements in a memory subsystem including a memory controller coupled to a DIMM showing two ranks of DRAM devices.

Embodiments of methods and apparatus implementing half width modes in DRAM and doubling of bank resources and associated are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

Figure 2:
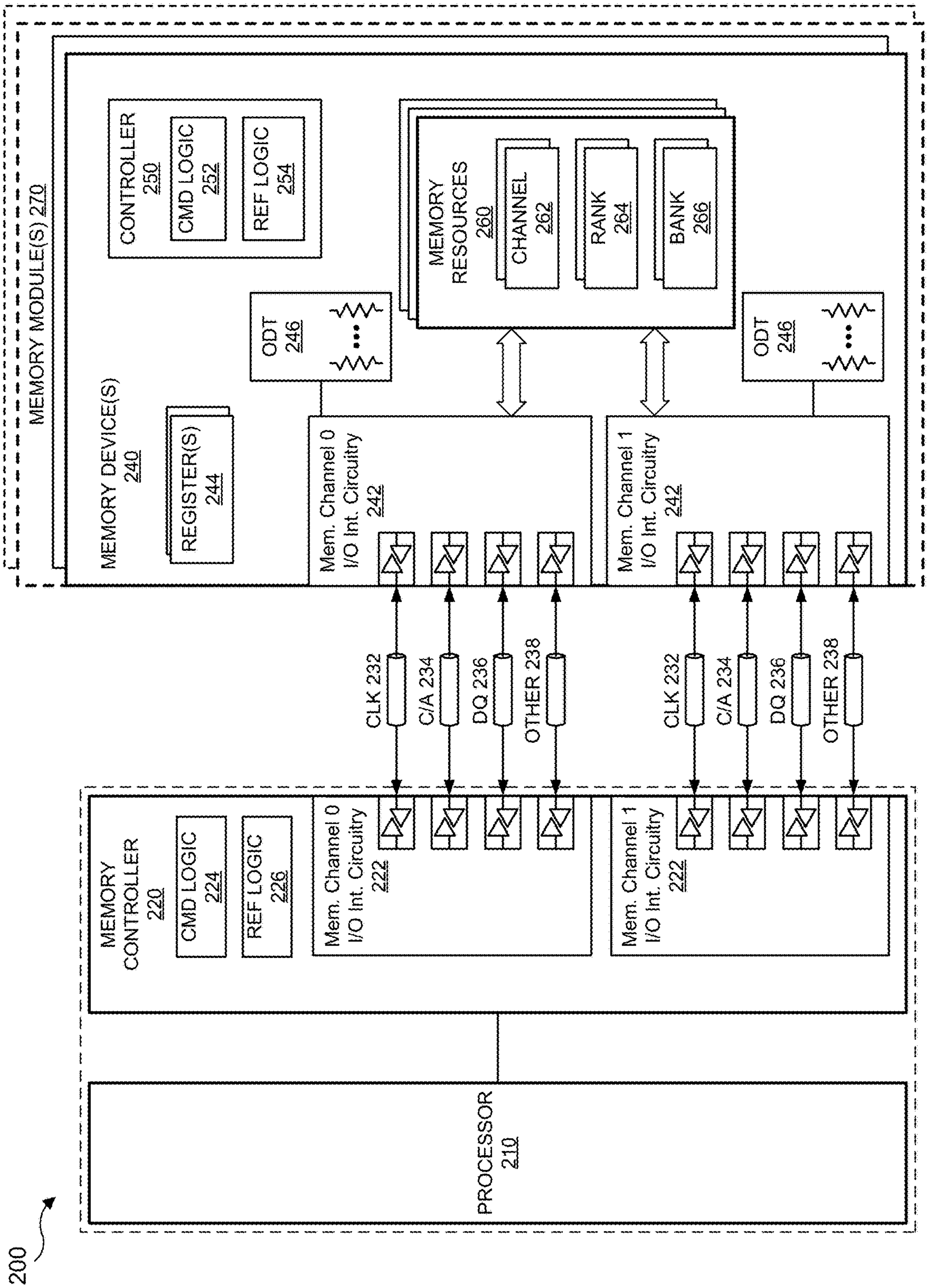
FIG. 2 is a diagram illustrating an example system including a memory controller with first and second memory channels.

To better understand aspects of the teachings and principles of the embodiments disclosed herein, a brief primer on the operation of DRAM is provided with reference an exemplary memory subsystem illustrated in FIG. 1 and an exemplary system illustrated in FIG. 2. As shown in FIG. 1, selective elements of a memory subsystem 100 include a memory controller 102 coupled to a DIMM (Dual Inline Memory Module) 104 showing two ranks of DRAM devices 106. Generally, a DRAM DIMM may have one or more ranks. Each DRAM device includes a plurality of banks comprising an array of DRAM cells 108 that are organized (laid out) and as rows and columns. Each row comprises a Wordline (or wordline), while each column comprises a Bitline (or bitline). Each DRAM device 106 further includes control logic 110 and sense amps 112 that are used to access DRAM cells 108.

As further shown in FIG. 1, memory controller provides inputs comprising command/address 114 and chip select 116. For memory Writes, the memory controller inputs further include data 118 that are written to DRAM cells 108 based on the address and chip select inputs. Similarly, for memory Reads, data 118 stored in DRAM cells 108 identified by the address and chip select inputs is returned to memory controller 102.

As described herein, reference to memory devices (e.g., DRAM devices) can apply to different volatile memory types. Volatile memory is memory whose state (and therefore the data stored on it) is indeterminate if power is interrupted to the device. Dynamic volatile memory requires refreshing the data stored in the device to maintain state. One example of dynamic volatile memory includes DRAM, or some variant such as synchronous DRAM (SDRAM). A memory subsystem as described herein may be compatible with a number of memory technologies or standards, such as DDR3 (double data rate version 3, JESD79-3, originally published by JEDEC (Joint Electronic Device Engineering Council) on Jun. 27, 2007), DDR4 (DDR version 4, JESD79-4, originally published in September 2012 by JEDEC), LPDDR3 (low power DDR version 3, JESD209-3B, originally published in August 2013 by JEDEC), LPDDR4 (low power DDR version 4, JESD209-4, originally published by JEDEC in August 2014), WIO2 (Wide IO 2 (WideIO2), JESD229-2, originally published by JEDEC in August 2014), HBM (high bandwidth memory DRAM, JESD235, originally published by JEDEC in October 2013), LPDDR5 (originally published by JEDEC in February 2019, current version published in June 2021), HBM2 ((HBM version 2), originally published by JEDEC in December 2018), DDR5 (DDR version 5, originally published by JEDEC in July 2020), or others or combinations of memory technologies, and technologies based on derivatives or extensions of such specifications. In addition to the foregoing, the specification for LPDDR6 is currently being developed.

Under conventional (S)DRAM memory, data are generally accessed (Read and Written) using cachelines (also called cache lines) comprising a sequence of memory cells (bits) in a wordline. The cachelines for a given memory architecture generally have a predetermined width or size, such as 64 Bytes, noting other widths/sizes may be used.

FIG. 2 illustrates an example system 200. In some examples, as shown in FIG. 2, system 200 includes a processor and elements of a memory subsystem in a computing device. Processor 210 represents a processing unit of a computing system that may execute an operating system (OS) and applications, which can collectively be referred to as the host or the user of the memory subsystem. The OS and applications execute operations that result in memory accesses. Processor 210 can include one or more separate processors. Each separate processor may include a single processing unit, a multicore processing unit, or a combination. The processing unit may be a primary processor such as a central processing unit (CPU), a peripheral processor such as a graphics processing unit (GPU), or a combination. Memory accesses may also be initiated by devices such as a network controller or hard disk controller. Such devices may be integrated with the processor in some systems or attached to the processer via a bus (e.g., a PCI express bus), or a combination. System 200 may be implemented as a system on a chip (SOC) or may be implemented with standalone components.

Reference to memory devices may apply to different memory types. Memory devices often refers to volatile memory technologies such as DRAM. In addition to, or alternatively to, volatile memory, in some examples, reference to memory devices can refer to a nonvolatile memory device whose state is determinate even if power is interrupted to the device. In one example, the nonvolatile memory device is a block addressable memory device, such as NAND or NOR technologies. A memory device may also include byte or block addressable types of non-volatile memory having a 3-dimensional (3-D) cross-point memory structure that includes, but is not limited to, chalcogenide phase change material (e.g., chalcogenide glass) hereinafter referred to as "3-D cross-point memory". Non-volatile types of memory may also include other types of byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), anti-ferroelectric memory, resistive memory including a metal oxide base, an oxygen vacancy base and a conductive bridge random access memory (CB-RAM), a spintronic magnetic junction memory, a magnetic tunneling junction (MTJ) memory, a domain wall (DW) and spin orbit transfer (SOT) memory, a thyristor based memory, a magnetoresistive random access memory (MRAM) that incorporates memristor technology, spin transfer torque MRAM (STT-MRAM), or a combination of any of the above.

Descriptions herein referring to a "RAM" or "RAM device" can apply to any memory device that allows random access, whether volatile or nonvolatile. Descriptions referring to a "DRAM", "SDRAM, "DRAM device" or "SDRAM device" may refer to a volatile random access memory device. The memory device, SDRAM or DRAM may refer to the die itself, to a packaged memory product that includes one or more dies, or both. In some examples, a system with volatile memory that needs to be refreshed may also include at least some nonvolatile memory.

Memory controller 220, as shown in FIG. 2, may represent one or more memory controller circuits or devices for system 200. Also, memory controller 220 may include logic and/or features that generate memory access commands in response to the execution of operations by processor 210. In some examples, memory controller 220 may access one or more memory device(s) 240. For these examples, memory device(s) 240 may be SDRAM or DRAM devices in accordance with any referred to above. Memory device(s) 240 may be organized and managed through different channels, where these channels may couple in parallel to multiple memory devices via buses and signal lines. Each channel may be independently operable. Thus, separate channels may be independently accessed and controlled, and the timing, data transfer, command and address exchanges, and other operations may be separate for each channel. Coupling may refer to an electrical coupling, communicative coupling, physical coupling, or a combination of these. Physical coupling may include direct contact. Electrical coupling, for example, includes an interface or interconnection that allows electrical flow between components, or allows signaling between components, or both. Communicative coupling, for example, includes connections, including wired or wireless, that enable components to exchange data.

According to some examples, settings for each channel are controlled by separate mode registers or other register settings. For these examples, memory controller 220 may manage a separate memory channel, although system 200 may be configured to have multiple channels managed by a single memory controller, or to have multiple memory controllers on a single channel. In one example, memory controller 220 is part of processor 210, such as logic and/or features of memory controller 220 are implemented on the same die or implemented in the same package space as processor 210, sometimes referred to as an integrated memory controller.

Memory controller 220 includes Input/Output (I/O) interface circuitry 222 to couple to a memory bus, which is replicated for two memory channels 0 and 1. I/O interface circuitry 222 (as well as I/O interface circuitry 242 of memory device(s) 240) may include pins, pads, connectors, signal lines, traces, or wires, or other hardware to connect the devices, or a combination of these. I/O interface circuitry 222 may include a hardware interface. As shown in FIG. 2, I/O interface circuitry 222 includes at least drivers/transceivers for signal lines. Commonly, wires within an integrated circuit interface couple with a pad, pin, or connector to interface signal lines or traces or other wires between devices. I/O interface circuitry 222 can include drivers, receivers, transceivers, or termination, or other circuitry or combinations of circuitry to exchange signals on the signal lines between memory controller 220 and memory device(s) 240. The exchange of signals includes at least one of transmit or receive. While shown as coupling I/O interface circuitry 222 from memory controller 220 to I/O interface circuitry 242 of memory device(s) 240, it will be understood that in an implementation of system 200 where groups of memory device(s) 240 are accessed in parallel, multiple memory devices can include I/O interface circuitry to the same interface of memory controller 220. In an implementation of system 200 including one or more memory module (s) 270, I/O interface circuitry 242 may include interface hardware of memory module(s) 270 in addition to interface hardware for memory device(s) 240. Other memory controllers 220 may include multiple, separate interfaces to one or more memory devices of memory device(s) 240.

In some examples, memory controller 220 may be coupled with memory device(s) 240 via multiple signal lines. The multiple signal lines may include at least a clock (CLK) 232, command/address (C/A) 234, and write data (DQ) and read data (DQ) 236, and zero or more other signal lines 238. According to some examples, a composition of signal lines coupling memory controller 220 to memory device(s) 240 may be referred to collectively as a memory bus. The signal lines for C/A 234 may be referred to as a "command bus", a "C/A bus" or a CMD/ADD bus, or some other designation indicating the transfer of commands and/or address data. The signal lines for DQ 236 may be referred to as a "data bus".

According to some examples, independent channels may have different clock signals, command buses, data buses, and other signal lines. For these examples, system 200 may be considered to have multiple "buses," in the sense that an independent interface path may be considered a separate bus. It will be understood that in addition to the signal lines shown in FIG. 2, a bus may also include at least one of strobe signaling lines, alert lines, auxiliary lines, or other signal lines, or a combination of these additional signal lines. It will also be understood that serial bus technologies can be used for transmitting signals between memory controller 220 and memory device(s) 240. An example of a serial bus technology is 8B10B encoding and transmission of high-speed data with embedded clock over a single differential pair of signals in each direction. In some examples, C/A 234 represents signal lines shared in parallel with multiple memory device (s) 240. In other examples, multiple memory devices share encoding command signal lines of C/A 234, and each has a separate chip select (CS_n) signal line to select individual memory device(s) 240.

In some examples, the bus between memory controller 220 and memory device(s) 240 includes a subsidiary command bus routed via signal lines included in C/A 234 and a subsidiary data bus to carry the write and read data routed via signal lines included in DQ 236. In some examples, C/A 234 and DQ 236 may separately include bidirectional lines. In other examples, DQ 236 may include unidirectional write signal lines to write data from the host to memory and unidirectional lines to read data from the memory to the host.

According to some examples, in accordance with a chosen memory technology and system design, signals lines included in other 238 may augment a memory bus or subsidiary bus. For example, strobe line signal lines for a DQS. Based on a design of system 200, or memory technology implementation, a memory bus may have more or less bandwidth per memory device included in memory device(s) 240. The memory bus may support memory devices included in memory device(s) 240 that have either a x32 interface, a x16 interface, a x8 interface, or other interface. The convention "xW," where W is an integer that refers to an interface size or width of the interface of memory device(s) 240, which represents a number of signal lines to exchange data with memory controller 220. The interface size of these memory devices may be a controlling factor on how many memory devices may be used concurrently per channel in system 200 or coupled in parallel to the same signal lines. In some examples, high bandwidth memory devices, wide interface memory devices, or stacked memory devices, or combinations, may enable wider interfaces, such as a x128 interface, a x256 interface, a x512 interface, a x1024 interface, or other data bus interface width.

According to some examples, memory device(s) 240 represent memory resources for system 200. For these examples, each memory device included in memory device (s) 240 is a separate memory die. Separate memory devices may interface with multiple (e.g., 2) channels per device or die. A given memory device of memory device(s) 240 may include I/O interface circuitry 242 and may have a bandwidth determined by an interface width associated with an implementation or configuration of the given memory device (e.g., x16 or x8 or some other interface bandwidth). I/O interface circuitry 242 may enable the memory devices to interface with memory controller 220. I/O interface circuitry 242 may include a hardware interface and operate in coordination with I/O interface circuitry 222 of memory controller 220.

In some examples, multiple memory device(s) 240 may be connected in parallel to the same command and data buses (e.g., via C/A 234 and DQ 236). In other examples, multiple memory device(s) 240 may be connected in parallel to the same command bus but connected to different data buses. For example, system 200 may be configured with multiple memory device(s) 240 coupled in parallel, with each memory device responding to a command, and accessing memory resources 260 internal to each memory device. For a write operation, an individual memory device of memory device(s) 240 may write a portion of the overall data word, and for a read operation, the individual memory device may fetch a portion of the overall data word. As non-limiting examples, a specific memory device may provide or receive, respectively, 8 bits of a 128-bit data word for a read or write operation, or 8 bits or 16 bits (depending for a x8 or a x16 device) of a 256-bit data word. The remaining bits of the word may be provided or received by other memory devices in parallel.

According to some examples, memory device(s) 240 may be disposed directly on a motherboard or host system platform (e.g., a PCB (printed circuit board) on which processor 210 is disposed) of a computing device. Memory device(s) 240 may be organized into memory module(s) 270. In some examples, memory module(s) 270 may represent dual inline memory modules (DIMMs). In some examples, memory module(s) 270 may represent other organizations or configurations of multiple memory devices that share at least a portion of access or control circuitry, which can be a separate circuit, a separate device, or a separate board from the host system platform. In some examples, memory module(s) 270 may include multiple memory device(s) 240, and memory module(s) 270 may include support for multiple separate channels to the included memory device(s) 240 disposed on them.

In some examples, memory device(s) 240 may be incorporated into a same package as memory controller 220. For example, incorporated in a multi-chip-module (MCM), a package-on-package with through-silicon via (TSV), or other techniques or combinations. Similarly, in some examples, memory device(s) 240 may be incorporated into memory module(s) 270, which themselves may be incorporated into the same package as memory controller 220. It will be appreciated that for these and other examples, memory controller 220 may be part of or integrated with processor 210.

As shown in FIG. 2, in some examples, memory device(s) 240 include memory resources 260. Memory resources 260 may represent individual arrays of memory locations or storage locations for data. Memory resources 260 may be managed as rows of data, accessed via wordline (rows) and bitline (individual bits within a row) control. Memory resources 260 may be organized as separate channels 262, ranks 264, and banks of memory 266. Channels may refer to independent control paths to storage locations within memory device(s) 240. Ranks may refer to common locations across multiple memory devices (e.g., same row addresses within different memory devices). Banks may refer to arrays of memory locations within a given memory device of memory device(s) 240. Banks may be divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to access memory resources 260. For example, the same physical memory locations can be accessed over a specific channel as a specific bank, which can also belong to a rank. Thus, the organization of memory resources 260 may be understood in an inclusive, rather than exclusive, manner.

According to some examples, as shown in FIG. 2, memory device(s) 240 include one or more register(s) 244. Register(s) 244 may represent one or more storage devices or storage locations that provide configuration or settings for operation memory device(s) 240. In one example, register(s) 244 may provide a storage location for memory device(s) 240 to store data for access by memory controller 220 as part of a control or management operation. For example, register (s) 244 may include one or more mode registers (MRs) and/or may include one or more multipurpose registers.

In some examples, writing to or programming one or more registers of register(s) 244 may configure memory device(s) 240 to operate in different "modes". For these examples, command information written to or programmed to the one or more register may trigger different modes within memory device(s) 240. Additionally, or in the alternative, different modes can also trigger different operations from address information or other signal lines depending on the triggered mode. Programmed settings of register(s) 244 may indicate or trigger configuration of I/O settings. For example, configuration of timing, termination, on-die termination (ODT), driver configuration, or other I/O settings.

According to some examples, memory device(s) 240 includes ODT 246 as part of the interface hardware associated with I/O interface circuitry 242. ODT 246 may provide settings for impedance to be applied to the interface to specified signal lines. For example, ODT 246 may be configured to apply impedance to signal lines include in DQ 236 or C/A 234. The ODT settings for ODT 246 may be changed based on whether a memory device of memory device(s) 240 is a selected target of an access operation or a non-target memory device. ODT settings for ODT 246 may affect timing and reflections of signaling on terminated signal lines included in, for example, C/A 234 or DQ 236. Control over ODT setting for ODT 246 can enable higher-speed operation with improved matching of applied impedance and loading. Impedance and loading may be applied to specific signal lines of I/O interface circuitry 242, 222 (e.g., C/A 234 and DQ 236) and is not necessarily applied to all signal lines.

In some examples, as shown in FIG. 2, memory device(s) 240 includes controller 250. Controller 250 may represent control logic within memory device(s) 240 to control internal operations within memory device(s) 240. For example, controller 250 decodes commands sent by memory controller 220 and generates internal operations to execute or satisfy the commands. Controller 250 may be referred to as an internal controller and is separate from memory controller 220 of the host. Controller 250 may include logic and/or features to determine what mode is selected based on programmed or default settings indicated in register(s) 244 and configure the internal execution of operations for access to memory resources 260 or other operations based on the selected mode. Controller 250 generates control signals to control the routing of bits within memory device(s) 240 to provide a proper interface for the selected mode and direct a command to the proper memory locations or addresses of memory resources 260. Controller 250 includes command (CMD) logic 252, which can decode command encoding received on command and address signal lines. Thus, CMD logic 252 can be or include a command decoder. With command logic 252, memory device can identify commands and generate internal operations to execute requested commands.

Referring again to memory controller 220, memory controller 220 includes CMD logic 224, which represents logic and/or features to generate commands to send to memory device(s) 240. The generation of the commands can refer to the command prior to scheduling, or the preparation of queued commands ready to be sent. Generally, the signaling in memory subsystems includes address information within or accompanying the command to indicate or select one or more memory locations where memory device(s) 240 should execute the command. In response to scheduling of transactions for memory device(s) 240, memory controller 220 can issue commands via I/O interface circuitry 222 to cause memory device(s) 240 to execute the commands. In some examples, controller 250 of memory device(s) 240 receives and decodes command and address information received via I/O interface circuitry 242 from memory controller 220. Based on the received command and address information, controller 250 may control the timing of operations of the logic, features and/or circuitry within memory device(s) 240 to execute the commands. Controller 250 may be arranged to operate in compliance with standards or specifications such as timing and signaling requirements for memory device(s) 240. Memory controller 220 may implement compliance with standards or specifications by access scheduling and control.

In some examples, memory controller 220 includes refresh (REF) logic 226. REF logic 226 may be used for memory resources that are volatile and need to be refreshed to retain a deterministic state. REF logic 226, for example, may indicate a location for refresh, and a type of refresh to perform. REF logic 226 may trigger self-refresh within memory device(s) 240 or execute external refreshes which can be referred to as auto refresh commands by sending refresh commands, or a combination. According to some examples, system 200 supports all bank refreshes as well as per bank refreshes. All bank refreshes cause the refreshing of banks within all memory device(s) 240 coupled in parallel. Per bank refreshes cause the refreshing of a specified bank within a specified memory device of memory device(s) 240. In some examples, controller 250 within memory device(s) 240 includes a REF logic 254 to apply refresh within memory device(s) 240. REF logic 254, for example, may generate internal operations to perform refresh in accordance with an external refresh received from memory controller 220. REF logic 254 may determine if a refresh is directed to memory device(s) 240 and determine what memory resources 260 to refresh in response to the command.

In accordance with aspects of the embodiments describe and illustrated herein, a half-width mode (also referred to as a BYTE mode) is provided that doubles the bank resources for a DRAM device. Doubling the bank resources substantially increases channel efficiency for both random read and random write accesses. This also improves (reduces) average channel latency.

Figure 3A:
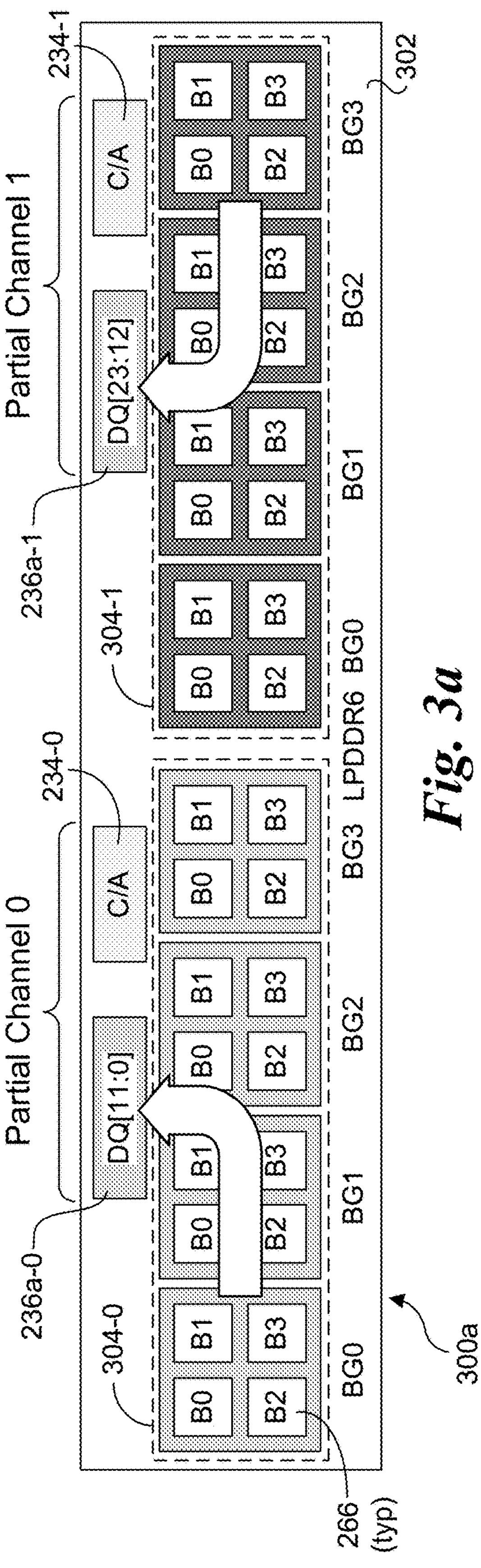
FIG. 3*a* is a diagram illustrating a half-width mode configuration for an x24 LPDDR6 memory die when operating in a first half-width mode under which a pair of partial channels 0 and 1 are active.

FIG. 3*a* shows a half-width mode configuration 300*a* for a single x24 LPDDR6 memory die 302 when operating in a first half-width mode under which a pair of partial channels 0 and 1 are active. The 24 DQ lines are split into two sets of 12 bits as depicted by DQ[11:0] lines 236*a*-0 and DQ[23:12] lines 236*a*-1. Each partial channel 0 and 1 also includes a respective set of C/A lines 234-0 and 234-1. Each partial channel is enabled to access half of the memory banks on x24 LPDDR6 memory die 302, has depicted by memory bank groups 304-0 and 304-1. Each of memory bank groups 304-0 and 304-1 includes four bank groups BG0, BG1, BG2, and BG3, with each bank group including four memory banks 266.

Under half-width mode configuration 300*a*, partial channels 0 and 1 operate independently and are enabled to concurrently access memory banks within respective memory bank groups 304-0 and 304-1 when coupled to separate channel I/O interfaces for a memory controller. However, partial channel 0 cannot be used to access any memory banks 266 in bank groups 304-1 and partial channel 1 cannot be used access any memory banks 266 in bank groups 304-1.

Figure 3B:
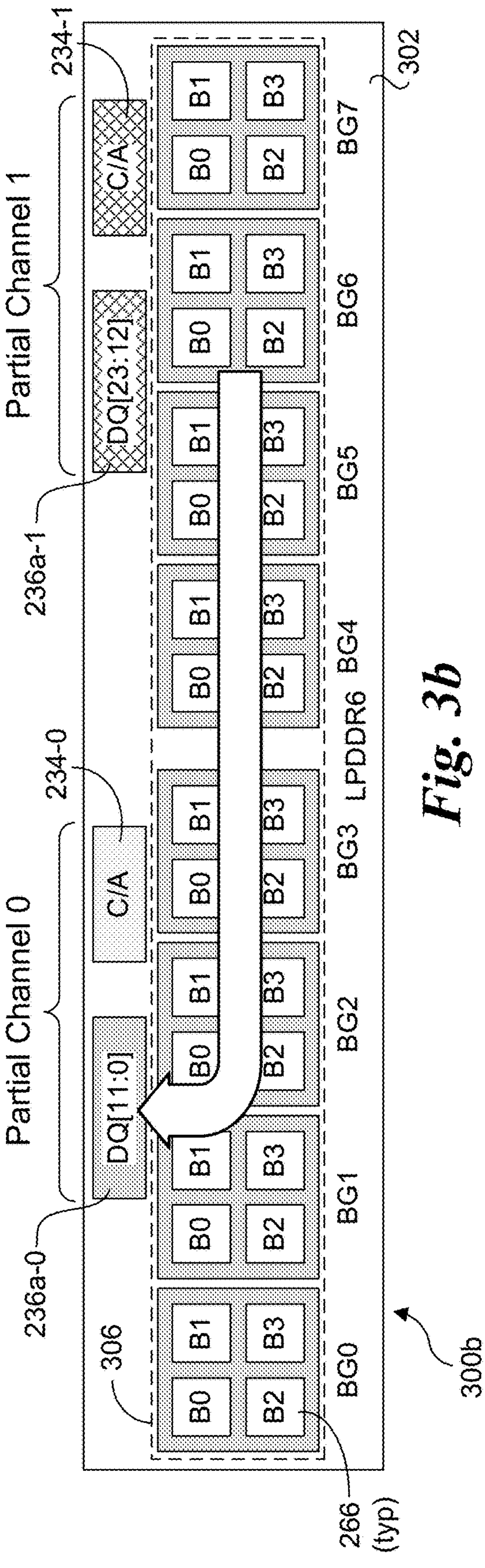
FIG. 3*b* is a diagram illustrating a half-width mode configuration for a x24 LPDDR6 memory die when operating in a second half-width mode under which partial channel 0 is active and is enabled to access any memory bank on the memory die.

FIG. 3*b* shows a half-width mode configuration 300*b* for x24 LPDDR6 memory die 302 when operating in a second half-width mode under which partial channel 0 is active and is enabled to access any memory bank 266 within any of bank groups BG0, BG1, BG2, BG3, BG4, BG5, BG6, and BG7 which collectively comprise bank groups 306. Under this configuration the DQ and C/A interfaces (DQ[23:12] lines 236*a*-1 and C/A lines 234-1) for partial channel 1 are inactive, with data and control signals being routed internally within to x24 LPDDR6 memory die 302 to the DQ and C/A interfaces (DQ[11:0] lines 236*a*-0 and C/A lines 234-0) for channel 0.

Figure 3C:
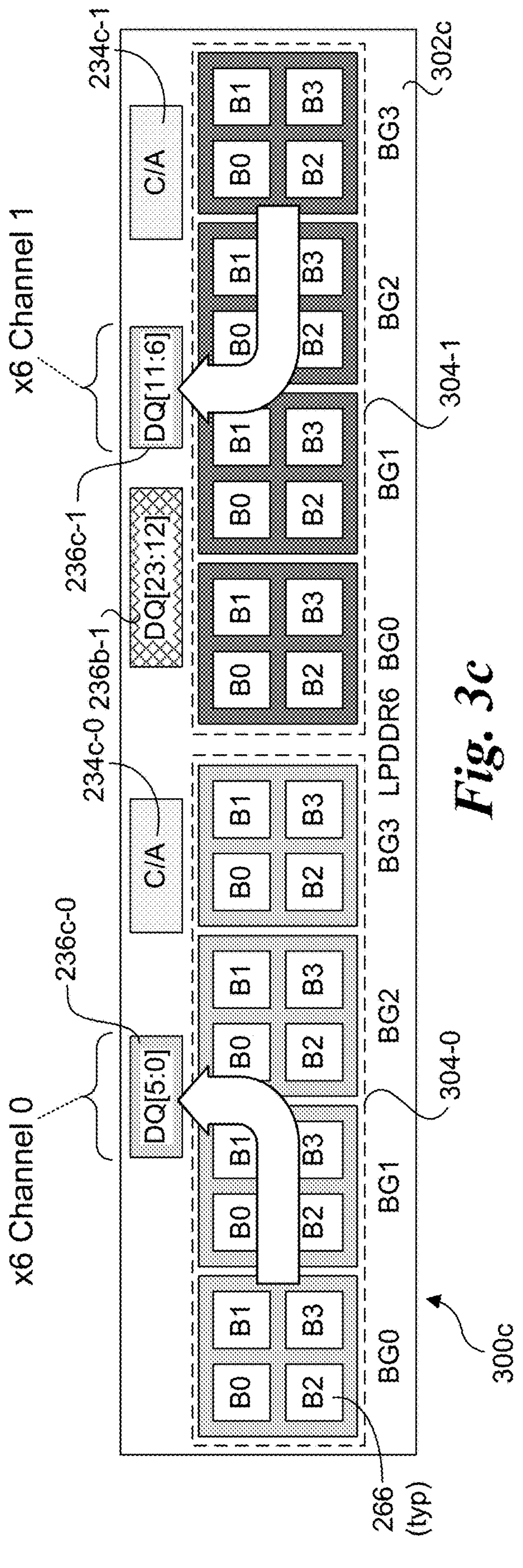
FIG. 3*c* is a diagram illustrating an x6 mode configuration for an x24 LPDDR6 memory die using two x6 channels 0 and 1.

FIG. 3*c* shows an x6 mode configuration 300*c* for an x24 LPDDR6 memory die 302*c* using two x6 channels 0 and 1. Channel 0 uses DQ[5:0] lines 236*c*-0 while channel 1 uses DQ[11:6] lines 236*c*-1. DQ[23:12] lines 236*b*-1 are inactive or disabled. Each of the x6 channels 0 and 1 operate independently. x6 channel 0 is enabled to access banks in bank groups 304-0 while x6 channel 1 is enabled to access banks in bank groups 304-1.

FIGS. 4*a* and 4*b* show truth tables 400 and 402 that respectively correspond to the embodiments of half-width mode configurations 300*a* and 300*b* in FIGS. 3*a* and 3*b*. The DDR Command Pins include CS, CA0, CA1 and CA2. The signals include:

- H: High
- L: Low
- X: Don't care
- BAx: Bank Address x
- BGx: Bank Group x
- V: High or Low
- Rx: Read Address bit x
- Cx: Column Address bit x
- AB: Command applied to All Banks, bank address is don't care
- AP: AP "HIGH" during WRITE, MASK WRITE or READ commands indicates that an auto-precharge will occur to the bank associated with the WRITE, MASK WRITE or READ command.
- Fn: Falling clock edge n
- Rn Rising clock edge n ACT-1 (ACTIVATE-1 command) must be followed by ACT-2 (ACTIVATE-2 command) for the same bank. Since the number of Bank Groups for half-width configuration 300*b* is 8, an extra BG address bit is used in truth table 402. For half-width configure 300*a*, an additional address bit R19 is added in truth table 400 (relative to the addressing available when using full-width (x24) channels. BL24 means Burst Length 24 bits.

Generally, the x24 LPDDR6 memory die described and illustrated herein may be implemented in a standalone package (e.g., an LPDDR6 integrated circuit package such as a chip, also referred to herein as an LPDDR6 memory device), in a LPDDR6 memory module including two or more LPDDR6 memory devices, or in a memory on package die layer. In some embodiments, an SoC with integrated memory controller and one or more LPDDR6 memory devices are coupled to a motherboard, system board, or the like. In some embodiments, an SoC die may be coupled to an LPDDR6 die via a die-to-die interconnect. In some embodiments a memory controller (or SoC with integrated memory controller) and an LPDDR6 die may be implemented in separate packages called chiplets that are interconnected with an Universal Chiplet Interconnect Express (UCIe) interconnect.

Figure 5:
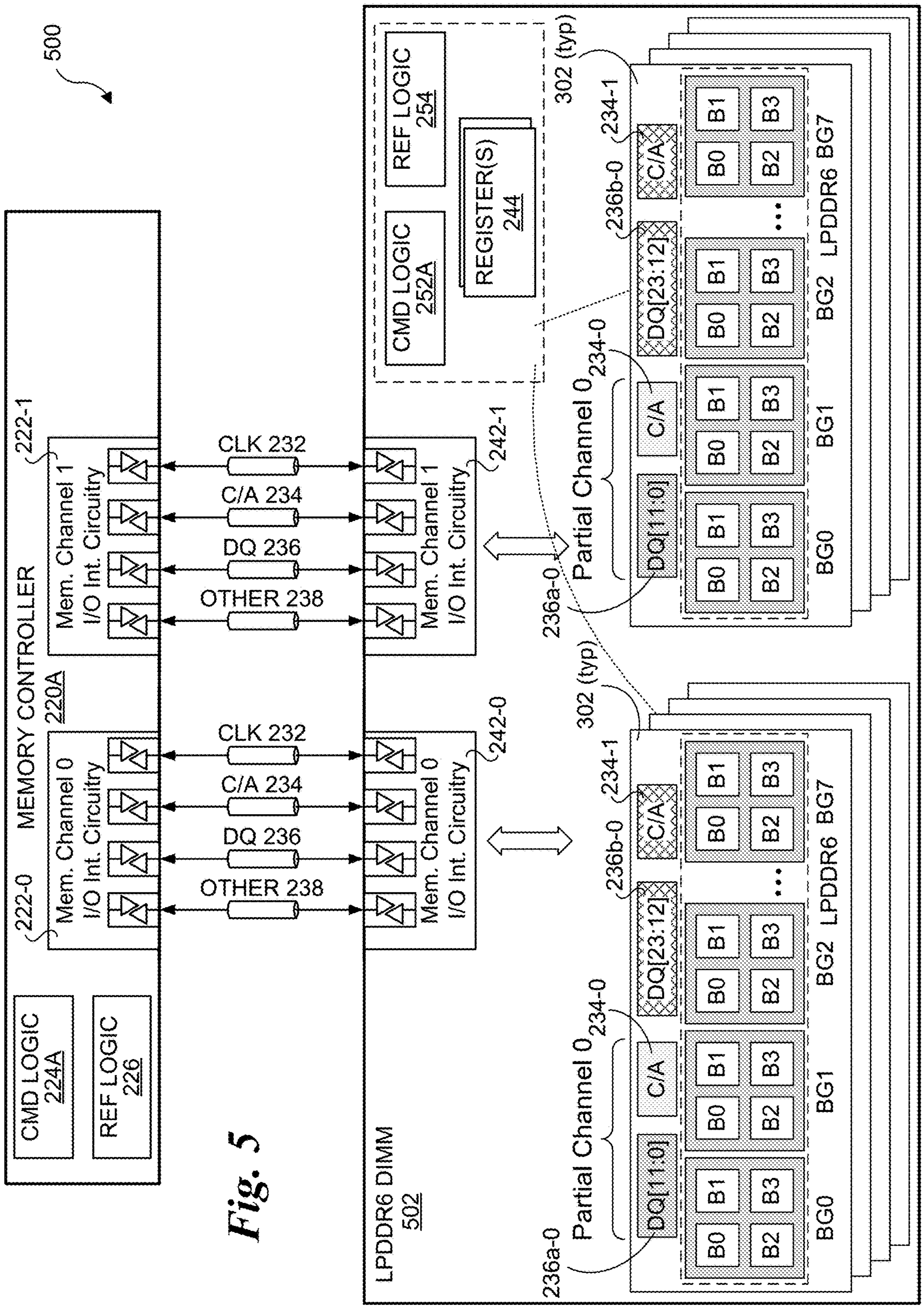
FIG. 5 is a diagram illustrating a first system including a memory controller coupled to a DIMM including multiple DRAM chips configured to operate in one or more half-width modes, according to one embodiment.

FIG. 5 shows an example of a system 500 employing an LPDDR6 DIMM (Dual Inline Memory Module) 502 including eight x24 LPDDR6 DIMMs 302 configured to operate in the half-width mode for configuration 300*b* and truth table 402. As shown, the DQ[11:0] lines 236*a*-0 and C/A lines 234-0 for partial channel 0 for four x24 LPDDR6 DIMMs 302 are communicatively coupled to memory channel 0 I/O interface circuitry 242-0, while the DQ and C/A lines for partial channel 0 for the other four x24 LPDDR6 DIMMs 302 are communicatively coupled to memory channel 1 I/O interface circuitry 242-1.

Memory controller 220A is generally configured similar to memory controller 220 in FIG. 2 with the command logic modified to support the half-width modes described and illustrated herein, as depicted by CMD logic 224A. In one embodiment (not shown), LPDDR6 DIMM 502 includes a modified controller including CMD logic and refresh logic that has been modified to support the half-width modes described and illustrated herein. In the embodiment illustrated in FIG. 5, each of x24 LPDDR6 DIMMs 302 include circuitry for implementing CMD logic 252A, refresh logic 254, and registers 244. In one embodiment both CMD logic 224A and CMD logic 252A would be configured to implement truth tables 400 and 402.

Figure 6:
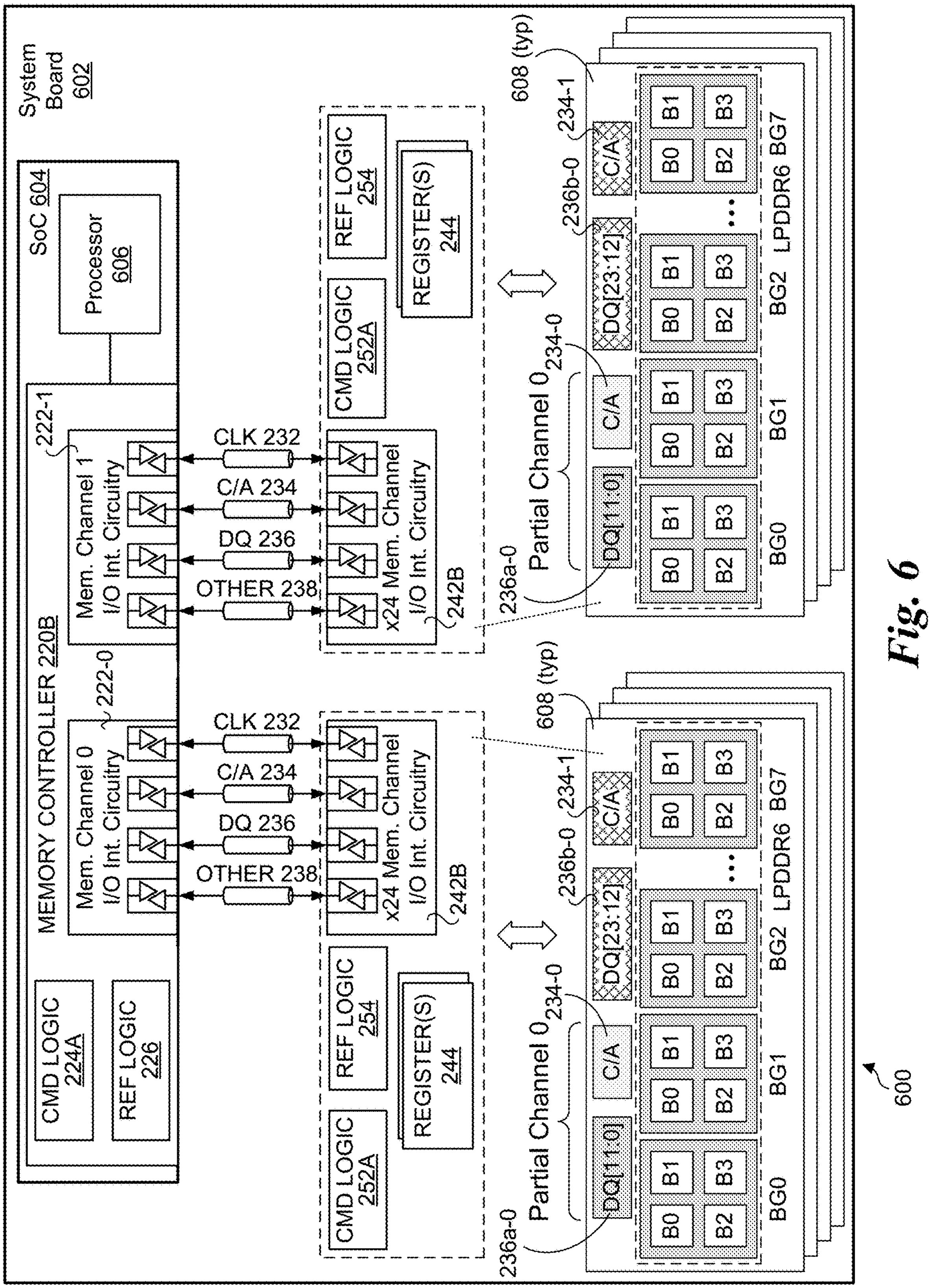
FIG. 6 is a diagram illustrating a second system including a memory controller interconnect via wiring in a system board to multiple DRAM chips configured to operate in one or more half-width modes, according to one embodiment.

In some embodiments, DRAM devices such as LPDDR6 chips may be coupled to a memory channel interface for a memory controller and/or SoC with integrated memory controller directly, rather than having the DRAM devices reside on a memory module. An example of a system 600 employing this approach is shown in FIG. 6.

System 600 includes a system board 602 to which an SoC 604 is mounted. SoC 604 includes a processor 606 and an integrated memory controller 220B having a configuration similar to memory controllers 220 and 220A discussed above, including I/O interface circuitry 222-0 and 222-1 for memory channels 0 and 1.

System 600 also includes a plurality of LPDDR6 DRAM chips 608 that are mounted to system board 602. Each LPDDR6 DRAM chip 608 includes an integrated memory channel I/O interface circuitry that is configured to interconnect with memory channel I/O interface circuitry for one of the memory channels on memory controller 220B, wherein the interconnect comprises wiring in system board 602. Generally, the number of DQ lines 236, C/A lines 234 and CLK signal lines 232 for the memory channels on the memory controller will be greater than the number of DQ lines and C/A lines connected to an individual LPDDR6 DRAM chip. For example, in one embodiment each memory channel I/O interface on the memory controller side includes 96 DQ lines, while in another embodiment each memory controller memory channel I/O interface includes 192 DQ lines. Meanwhile, in one embodiment the LPDDR6 DRAM chips are x24 LPDDR6 devices having 24 DQ lines, as depicted by x24 memory channel I/O interface circuitry 242B. In yet other embodiments, an LPDDR6 DRAM chip may be configured from the manufacturer to only operate in a single half-width channel mode using an x12 DQ bus.

Generally, an LPDDR6 DRAM chips that is directly connection to a memory controller channel I/O interface will include applicable logic to facilitate operations in accordance with operating modes defined by a forthcoming LPDDR6 standard, including command logic, refresh logic, clock timing logic, etc. Accordingly, as further shown in FIG. 6, each LPDDR6 DRAM chip includes circuitry for implementing CMD logic 252A, Refresh logic 254, and registers 244.

In addition to operating in a single channel half-width mode, such as depicted by partial channel 0 in FIGS. 5 and 6, in some embodiments, the LPDDR6 DRAM chips may also be configured to operate in the partial channel half-width mode illustrated in FIG. 3*a* discussed above. For an LPDDR6 DIMM implementation, applicable wiring would be provided on the DIMM board to connect to both of the memory channel I/O interfaces. Under system 600, system board 602 would include applicable wiring to connect the partial memory channel I/O interface circuitry on the LPDDR6 DRAM chips to the memory channel I/O interface circuitry on memory controller 202B.

Generally, the principles and teachings disclosed herein may be applied to various packages and configurations, including stacked die structures and packages, such as processor-in-memory (PIM) modules. (PIM modules may also be called compute on memory modules or compute near memory modules.) PIMs may be used for various purposes but are particularly well-suited for memory-intensive workload such as but not limited to performing matrix mathematics and accumulation operations. In a PIM module (which are sometimes called PIM chips when the stacked die structures are integrated on the same chip), the processor or CPU and stacked memory structures are combined in the same chip or package.

Figure 7A:
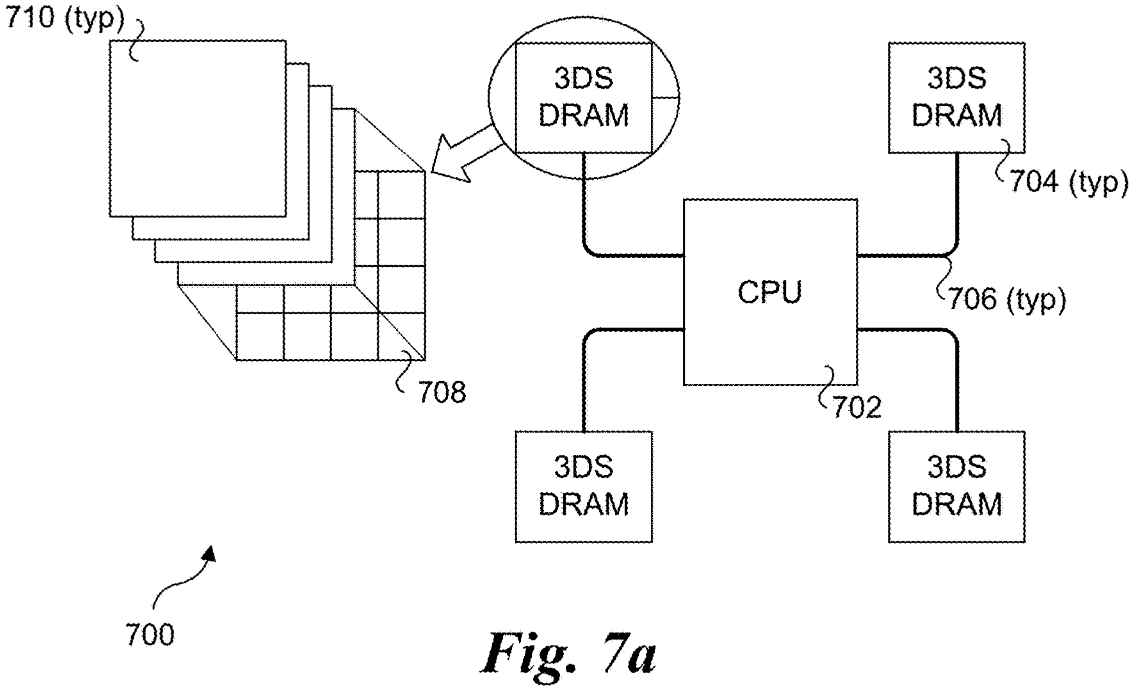
FIG. 7*a* is a diagram illustrating an example of a PIM module.
Figure 7B:
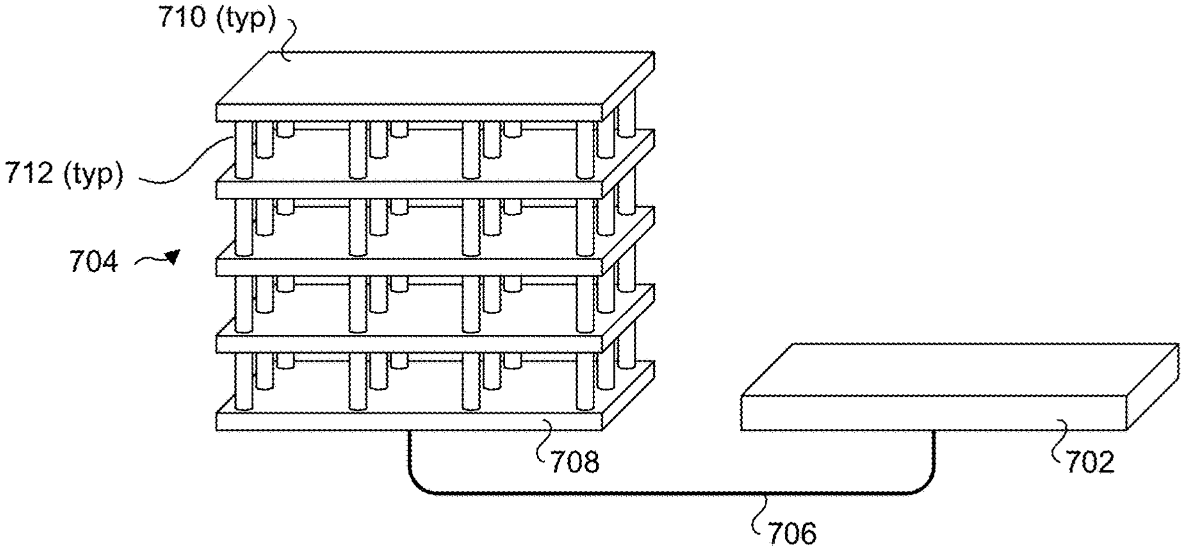
FIG. 7*b* shows further details of the structure of a PIM module.

An example of a PIM module 700 is shown in FIGS. 7*a* and 7*b*. PIM module 700 includes a CPU 702 coupled to 3DS (three dimensional stacked) LPDDR6 DRAMs 704 via respective memory channels 706, observing there may be multiple memory channels coupled between a CPU and a 3DS DRAM. As shown in the blow-up detail, a 3DS DRAM includes a logic layer comprising a logic die or compute die 708 above which multiple LPDDR6 DRAM dies 710 are stacked. Logic die or compute die 708 and LPDDR6 DRAM dies 710 are interconnected by TSVs 712.

An aspect of PIM modules is that the logic layer may perform compute operations that are separate from the compute operations performed by the CPU, hence comprise a compute die. In some instances, the logic layer comprises a processor die or the like. For example, a system may be implemented using a 3D stacked structure similar to that shown in FIG. 7*b*, where compute die 708 comprises an SoC with one or more compute elements (e.g., processor cores) and an integrated memory controller. In one embodiment, a portion of TSVs 712 is used for memory controller I/O interface interconnects for one or more memory channels. The number and density of the TSV is much greater than shown in FIG. 7*b*, which shows a simplified representation of the 3D stacked structure of an exemplary PIM.

Figure 7C:
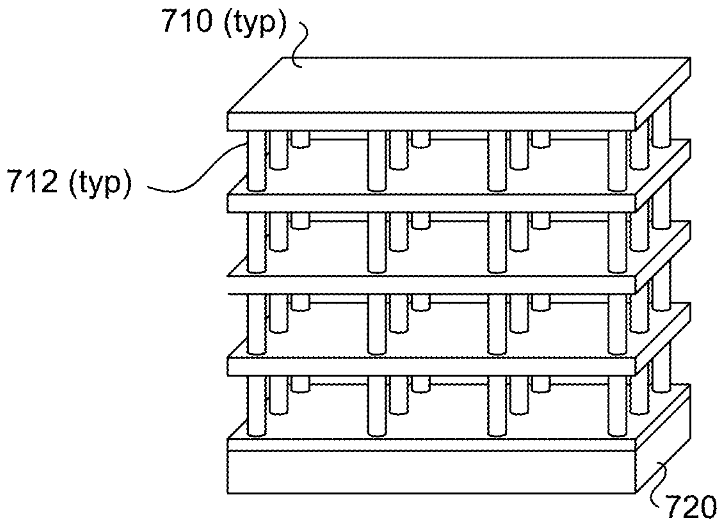
FIG. 7*c* shows another example of a PIM module including a CPU or XPU coupled to DRAMs in a stacked 3D structure.
Figure 7D:
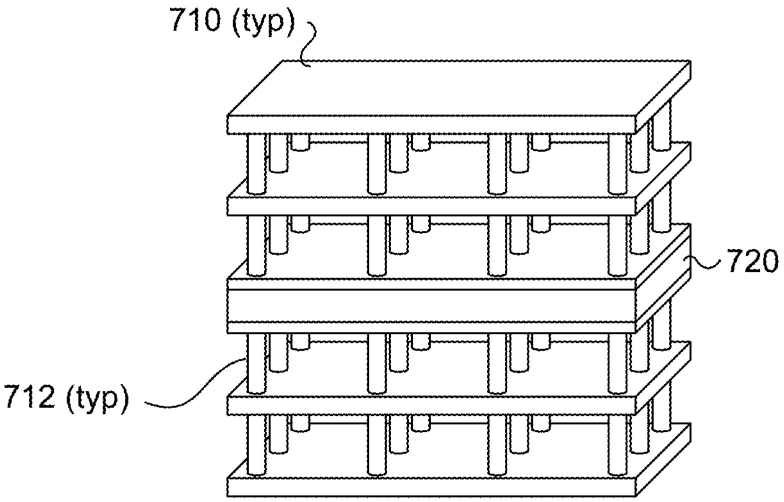
FIG. 7*d* shows a variant of the PIM module of FIG. 7*c* where there are one or more layers of DRAM dies stacked above and below the CPU or XPU.

FIGS. 7*c* and 7*d* show an example of a CPU or XPU (Other Processing Unit) 720 that is used in place of logic die or compute die 708 without a separate CPU or XPU. Under the embodiment shown in FIG. 7*c*, multiple layers of LPDDR6 DRAM dies 710 are above CPU/XPU 720. In the embodiment shown in FIG. 7*d*, one or more layers of LPDDR6 DRAM dies 710 are above and below CPU/XPU 720.

In addition to systems with CPUs, the teaching and principles disclosed herein may be applied to Other Processing Units (collectively termed XPUs) including one or more of Graphic Processor Units (GPUs) or General Purpose GPUs (GP-GPUs), Tensor Processing Units (TPUs), Data Processing Units (DPUs), Infrastructure Processing Units (IPUs), Artificial Intelligence (AI) processors or AI inference units and/or other accelerators, FPGAs and/or other programmable logic (used for compute purposes), etc. While some of the diagrams herein show the use of CPUs, this is merely exemplary and non-limiting. Generally, any type of XPU may be used in place of a CPU or processor in the illustrated embodiments. Additionally, the term processor in the claims may refer to a CPU or an XPU.

In addition to 3D stacked structures with TSVs, other types of packaging may be used, such as multichip modules and packages using die-to-die or chiplet-to-chiplet interconnect structures. For instance, in one embodiment memory channels 706 in FIGS. 7*a* and 7*b* are implemented using TSVs in a silicon die-to-die interconnect.

Performance Improvement Results

Memory efficiency estimates for embodiments described and illustrated above demonstrate significant performance improvement when compared to existing techniques. For example, doubling of bank resources from 16 to 32 improves channel efficiency from 63% to 95% for 100% read case using random accesses (1 CAS per ACT). Doubling of bank resources from 16 to 32 improves channel efficiency from 50% to 100% for 100% write case using random accesses (1 CAS per ACT). In addition, there is a 10-15 ns improvement in average latency as a result of improved channel efficiency.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Italicized letters, such as 'n' in the foregoing detailed description are used to depict an integer number, and the use of a particular letter is not limited to particular embodiments. Moreover, the same letter may be used in separate claims to represent separate integer numbers, or different letters may be used. In addition, use of a particular letter in the detailed description may or may not match the letter used in a claim that pertains to the same subject matter in the detailed description.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A Dynamic Random Access Memory (DRAM) device, comprising:
- a plurality of bank groups, each bank group comprising multiple memory banks, each memory bank including a plurality of memory cells arranged in rows and columns; and
- memory channel input/output (I/O) circuitry for first and second memory channels, the memory channel I/O circuitry for each of the first and second memory channels comprising a plurality of signal lines including one or more clock signal lines, a set of Command/Address (C/A) signal lines, and a plurality of DQ lines for read data and write data,
- wherein the DRAM device is configured to be selectively operated in a first half-width mode under which a subset of the plurality of DQ lines for the first memory channel operate as a first half-width DQ data bus and the first memory channel is enabled to access all the plurality of memory banks, and wherein the memory channel I/O circuitry for the second memory channel is inactive.

2. The DRAM device of claim 1, wherein the DRAM device comprises a Low-Power Double Data Rate sixth generation (LPDDR6) Synchronous DRAM (SDRAM) device.

3. The DRAM device of claim 2, wherein the DRAM device is an x24 LPDDR6 SDRAM device having 24 DQ lines.

4. The DRAM device of claim 1, wherein the DRAM device includes 32 banks arranged in 8 bank groups.

5. The DRAM device of claim 1, wherein the first half-width data bus has a width of 12 bits.

6. The DRAM device of claim 1, wherein the DRAM device is configured to be selectively operated in a second half-width mode under which a subset of the plurality of DQ lines for each of the first and second memory channels operate as a half-width DQ data bus, wherein when the DRAM device is operated in the second half-width mode, the first and second memory channels are enabled to access respective first and second portions of the plurality of memory banks, wherein none of the plurality of memory banks is included in both the first and second portions of memory banks.

7. The DRAM device of claim 6, wherein when the DRAM device is operated in the second half-width mode the first memory channel and second memory channel are enabled to operate independently to concurrently transfer data over their respective half-width data buses.

8. The DRAM device of claim 6, wherein each of the half-width DQ data buses has a width of 12 bits.

9. A memory module comprising:
- module memory channel input/output (I/O) circuitry configured to interface with first and second memory channels for a memory controller, comprising a first plurality of signal lines including one or more clock signal lines, a set of Command/Address (C/A) signal lines, and a plurality of DQ lines for read data and write data; and a plurality of Dynamic Random Access Memory (DRAM) devices, each comprising, a plurality of bank groups, each bank group comprising multiple memory banks, each memory bank including a plurality of memory cells arranged in rows and columns; and device memory channel I/O circuitry for a first device memory channel comprising a second plurality of signal lines including one or more clock signal lines, a set of C/A signal lines, and a set of DQ lines for read data and write data, wherein, for each DRAM device the device memory channel I/O circuitry for the first device memory channel is coupled to the module memory channel I/O circuitry for the first or second memory channel, and wherein at least one of the plurality of DRAM devices is configured to be selectively operated in a first half-width mode under which a subset of the plurality of DQ lines for the first device memory channel operate as a first half-width DQ data bus and the first memory channel is enabled to access all the plurality of memory banks in the DRAM device, and wherein the memory channel I/O circuitry for the second memory channel is inactive.

10. The memory module of claim 9, wherein each of the plurality of DRAM devices is configured to be selectively operated in the first half-width, and wherein a first portion of the plurality of DRAM devices are coupled to the module memory channel I/O circuitry for the first memory channel and a second portion of the plurality of DRAM devices are coupled to the module memory channel I/O circuitry for the second memory channel.

11. The memory module of claim 10, wherein each of the plurality of DRAM devices comprises an x24 LPDDR6 SDRAM device having 24 DQ lines.

12. The memory module of claim 9, wherein each of the plurality of DRAM devices comprises a Low-Power Double Data Rate sixth generation (LPDDR6) Synchronous DRAM (SDRAM) device.

13. The memory module of claim 9, wherein a DRAM device includes device memory channel I/O circuitry for a second device memory channel comprising a third plurality of signal lines including one or more clock signal lines, a set of C/A signal lines, and a set of DQ lines for read data and write data.

14. The memory module of claim 9, wherein the DRAM device is configured to be selectively operated in a second half-width mode under which a subset of the plurality of DQ lines for each of the first and second memory channels operate as a half-width DQ data bus, wherein when the DRAM device is operated in the second half-width mode, the first and second memory channels are enabled to access respective first and second portions of the plurality of memory banks, wherein none of the plurality of memory banks is included in both the first and second portions of memory banks.

15. The memory module of claim 14, wherein when the DRAM device is operated in the second half-width mode the first memory channel and second memory channel are enabled to operate independently to concurrently transfer data over their respective half-width data buses.

16. A system comprising:

a memory controller having first and second memory channel interfaces having input/output (I/O) circuitry for first and second memory channels, each memory channel interface comprising a first plurality of signal lines including one or more clock signal lines, a set of Command/Address (C/A) signal lines, and a plurality of DQ lines for read data and write data; and a plurality of Dynamic Random Access Memory (DRAM) devices, each operatively coupled to the first or second memory channel interface for the memory controller and including, a plurality of bank groups, each bank group comprising multiple memory banks, each memory bank including a plurality of memory cells arranged in rows and columns; and device memory channel I/O circuitry for a first device memory channel comprising a second plurality of signal lines including one or more clock signal lines, a set of C/A signal lines, and a set of DQ lines for read data and write data, wherein at least one of the plurality of DRAM devices is configured to be selectively operated in a first half-width mode under which a subset of the plurality of DQ lines for the first device memory channel operate as a first half-width DQ data bus and the first memory channel is enabled to access all the plurality of memory banks in the DRAM device, and wherein the memory channel I/O circuitry for the second memory channel is inactive.

17. The system of claim 16, wherein the plurality of DRAM devices comprises a plurality of DRAM dies that are stacked above, below, or both above and below a compute die including the memory controller, and wherein the DRAM dies and the compute die are interconnected with through silicon vias (TSVs).

18. The system of claim 16, wherein the memory controller is integrated in a System on a Chip (SoC) including a processor and the plurality of DRAM devices comprise DRAM chips, further comprising a board to which the SoC and the plurality of DRAM chips are mounted, the board including wiring coupling the DRAM chips to the first and second memory channel interfaces for the memory controller.

19. The system of claim 16, wherein the wherein the memory controller is integrated in a System on a Chip (SoC) including a processor and the plurality of DRAM devices comprise DRAM chips that are mounted to a memory module having I/O circuitry comprising first and second memory channel interfaces configured to interconnect with the I/O circuitry of the first and second memory channels on the memory controller, further comprising a board to which the SoC and the memory module are coupled, the board including wiring coupling the first and second memory channel interfaces of the memory controller with the first and second memory channel interfaces for the memory module.

20. The system of claim 16, each of the plurality of DRAM devices comprises a Low-Power Double Data Rate sixth generation (LPDDR6) Synchronous DRAM (SDRAM) device.

* * * * *